United States Patent [19]

Koga

[11] Patent Number: 5,661,065

[45] Date of Patent: Aug. 26, 1997

[54] METHOD FOR FABRICATING SEMICONDUCTOR MEMORY DEVICE HAVING A CAPACITOR

[75] Inventor: Hiroki Koga, Tokyo, Japan

[73] Assignee: NEC Corporation, Tokyo, Japan

[21] Appl. No.: 649,297

[22] Filed: May 17, 1996

[30] Foreign Application Priority Data

May 22, 1995 [JP] Japan .................................. 7-146825

[51] Int. Cl.$^6$ .............................................. H01L 21/8242
[52] U.S. Cl. ................................... 438/253; 438/396
[58] Field of Search ................... 437/47, 52, 919, 437/60

[56] References Cited

U.S. PATENT DOCUMENTS 5,164,337  11/1992  Ogawa et al. ................. 437/52
5,386,382   1/1995  Ahn ................................ 437/52
5,536,671   7/1996  Park .............................. 437/52

FOREIGN PATENT DOCUMENTS 6-151749  5/1994  Japan .

Primary Examiner—Jey Tsai
Attorney, Agent, or Firm—Sughrue, Mion, Zinn, Macpeak & Seas

[57] ABSTRACT

A gate electrode and a digit line that work as a word line are formed. A second inter-layer insulation film is formed on the digit line. Thereafter, a second contact hole is formed. A polycrystal silicon film and an insulation film are successively formed. These films are patterned in predetermined shapes, and a polycrystal silicon film is formed and then anisotropically etched out by the RIE method. Just after that, the resultant structure is isotropically dry-etched so as to remove a sharp portion of the edge portion of the side wall portion, and then the insulation film is wet-etched with hydrofluoric acid. Thus, the insulation film is completely removed. As a result, a storage electrode of a cylinder-shaped stacked type capacitor is formed.

2 Claims, 8 Drawing Sheets

F I G. 10
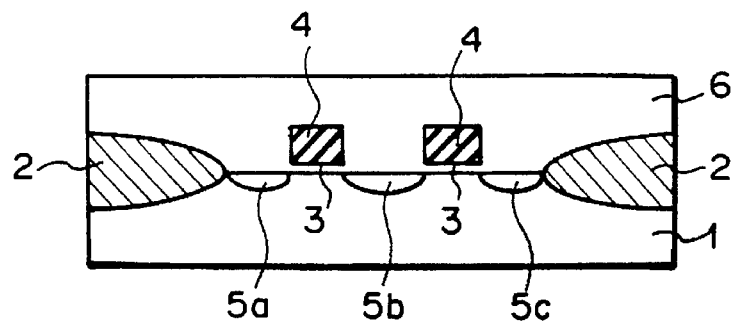
F I G. 11
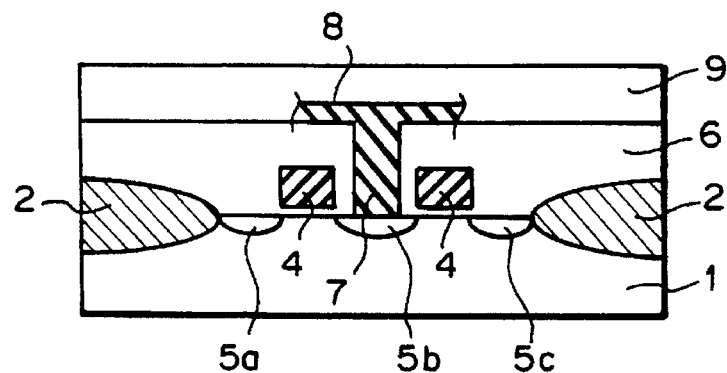
F I G. 12
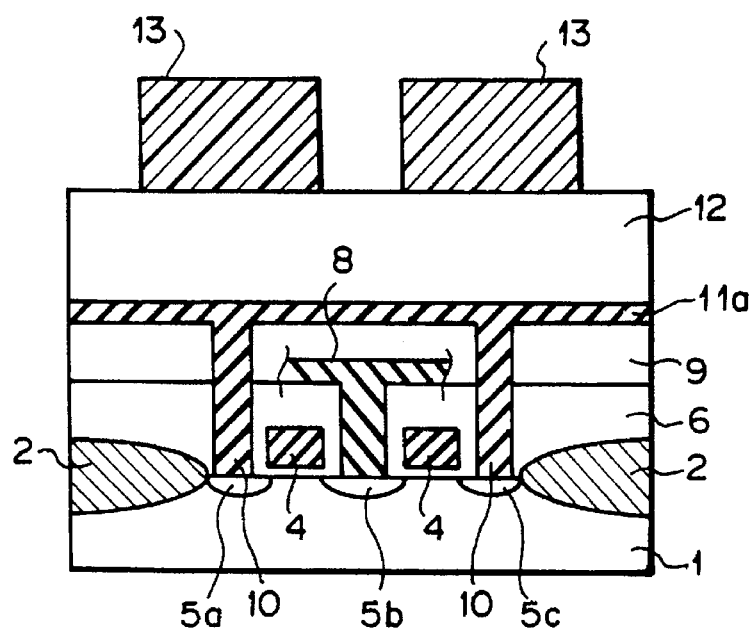

METHOD FOR FABRICATING SEMICONDUCTOR MEMORY DEVICE HAVING A CAPACITOR

BACKGROUND OF THE INVENTION

1. Field of the Invention

The present invention relates to a method for fabricating a semiconductor memory device, in particular, to a method for fabricating a dynamic random access memory (DRAM) having memory cells each of which is composed of a transistor and a stacked type capacitor.

2. Description of the Related Art

As a semiconductor memory device of which information can be read and written at any desired timing, a dynamic random access memory (DRAM) is known. Generally, the DRAM is composed of a memory cell array and a peripheral circuit. The memory cell array stores a large amount of information. The peripheral circuit inputs/outputs signals from/to the outside of the DRAM.

In the conventional DRAM, one memory cell thereof is composed of one transistor and one capacitor. The capacitor stores information corresponding to the storage amount of electric charges can be generally classified as a planer type, a trench type, and a stacked type. In the planer type, the capacitor is formed on a front surface of the silicon substrate. In the trench type, a groove is formed in the silicon substrate. The side walls of the groove are used as a capacitor. In the stacked type, an electrode is disposed on the silicon substrate. The upper surface and the side surface of the electrode are used as a capacitor. In the stacked type capacitor, the storage electrode can be extended to a field oxide film, a gate electrode, or an upper portion of a digit line. Thus, the capacitance of the capacitor can be increased corresponding to the increase of the surface area of the capacitor.

As the integration and density of the DRAM are becoming high, the surface area of the storage electrode decreases. Since the storage electric charge amount is proportional to the storage electrode area, the storage charge capacitance that can satisfactorily withstand a soft error cannot be accomplished. Thus, in the conventional DRAMs, the stacked type capacitor is widely used.

To secure a particular amount of storage electric charge for the structure of which the integration and density of the DRAMs is further increased, a cylinder-shaped stacked type capacitor has been proposed. The conventional stacked type capacitor uses upper and side surfaces of the stacked electrode for securing a desired capacity, whereas the cylinder-shaped stacked type capacitor uses a bottom surface, an outer side surface, and an inner side surface. Thus, the surface area of the storage electrode of the cylinder-shaped stacked type capacitor is larger than that of the stacked type capacitor for the area of the inner side surface.

As such a prior art, a method for fabricating a semiconductor device has been proposed as JPA Hei 6-151749.

Next, with reference to FIGS. 1 to 8, the known method for fabricating a cylinder-shaped stacked type capacitor will be described.

As shown in FIG. 1, a device separating oxide film 2 composed of a silicon oxide film is formed at a predetermined region on a main front surface of a P type silicon substrate 1 by the LOCOS method for a thickness of 4000 angstroms. Thereafter, a gate oxide film 3 is formed by a heat oxidizing method or the like. A gate electrode 4 composed of a polycrystal silicon of which a large amount of arsenic (As) or phosphorus (P) has been doped is selectively formed on the gate oxide film 3. Thereafter, ions of arsenic (As) are injected into the oxide film 3. Thus, diffusion layers 5a, 5b, and 5c are formed as a cell transistor. Next, a first inter-layer insulation film 6 is formed of a silicon oxide film ($SiO_2$) or a silicon nitride film ($Si_3N_4$).

Thereafter, as shown in FIG. 2, a first contact hole 7 that extends to the diffusion layer 5b is formed. A polycrystal silicon of which a large amount of arsenic (As) or phosphorus (P) has been doped is deposited on the entire front surface of the resultant structure and then patterned in a predetermined shape, thereby to form a digit line 8. Then, a second inter-layer insulation film 9 is formed of a silicon oxide film ($SiO_2$) or a silicon nitride film ($Si_3N_4$).

Next, as shown in FIG. 3, a second contact hole 10 which extends to the diffusion layers 5a and 5c is formed. A polycrystal silicon film 11a of which a large amount of arsenic (As) or phosphorus (P) has been doped is formed on the entire front surface of the resultant structure by the CVD method for a thickness of 1500 to 4000 angstroms. Thereafter, an insulation film 12 composed of a silicon oxide film is formed on the entire front surface of the resultant structure by the CVD method for a thickness of 5000 to 10000 angstroms. The height of the side surface portion of the storage electrode of the capacitor is defined by the film 12 thickness of the insulation film 12. Thereafter, a photoresist is applied on the front surface of the insulation film 12 and then patterned in a predetermined shape by a well known lithography method or the like, thereby to form a resist pattern 13.

Thereafter, as shown in FIG. 4, with a mask of the resist patter 13, the insulation film 12 is selectively removed by an etching process such as, for example, an anisotropic etching process. The resist pattern 13 is removed by ashing. With a mask of the patterned insulation film 12, a base portion 11b of the cylinder-shaped stacked type capacitor storage electrode is formed by for example the anisotropic etching method. Alternatively, with the resist pattern 13, the insulation film 12 is patterned. Just after that, with a mask of the resist pattern 13, the base portion 11b may be anisotropically etched out.

Next, as shown in FIG. 5, a polycrystal silicon film 14a of which a large amount of arsenic (As) or phosphorus (P) has been doped is formed on the entire front surface of the resultant structure for a thickness of 500 to 1000 angstroms by the CVD method. The polycrystal silicon film 14a is anisotropically etched out by the RIE (reactive ion etching) method. The RIE method can be performed with a parallel plate type RIE unit in the conditions that the radio frequency power is 0.3 Kw/cm$^2$, the gas pressure is 150 mT, the flow rate of a chlorine ($Cl_2$) gas is 50 sccm, the frequency is 13.56 MHz, and the etching time is 30 to 60 seconds.

Thereafter, the insulation film 12 is etched out for a predetermined thickness by a wet etching method using hydrogen fluoride, for example, so as to expose an edge portion of a side wall portion 14b. By anisotropically etching out the polycrystal silicon film 14a, a side wall portion 14b is formed in a shape as shown a in FIGS. 6A and 6B. FIG. 6B is an enlargement view showing a portion X of FIG. 6A.

In this state, the edge portion of the side wall portion 14b is sharply formed as illustrated in FIG. 6A. When a capacitor is formed on the side wall portion 14b, an electric field concentrates at the sharp portion. Thus, the service life of the capacitance insulation film decreases.

To solve this problem, the following process is performed. As shown in FIG. 7, the edge potion of the side wall portion 14b is spatter etched out with an inert gas such as argon (Ar) gas. For example, the spatter etching process is performed with the parallel plate type RIE unit in the conditions that the radio frequency power is in the range from 0.2 to 1.9 kW/cm$^2$, the gas pressure is 30 mT or less the flow rate of argon (Ar) gas is in the range from 20 to 50 sccm, the frequency is 13.56 MHz or less, and the spatter etching time is in the range from 1 minute to 3 minutes. In the spatter etching process with an inert gas, since silicon crystal is physically etched out, the protruded portion is first etched out.

In the state shown in FIG. 6A, the side wall portion 14b is etched out by the spatter etching method. Thereafter, the insulation film 12 is completely removed by the wet etching method using hydrogen fluoride. Finally, a side wall portion 14c in a shape shown in FIGS. 8A and 8B is obtained. FIG. 8B is an enlargement view showing a portion Y of FIG. 8A.

Thus, the storage electrode of the cylinder-shaped stacked type capacitor that does not have a sharp edge portion of the side wall portion 14c is obtained.

As described above, the edge of the side wall portion 14b of the storage electrode of the cylinder-shaped stacked type capacitor shown in FIGS. 6A and 6B is sharply formed. When a capacitor is formed on the storage electrode, since the electric field concentrates at the edge portion of the side wall portion 14b, the service life of the capacitor insulation film decreases. In addition, when a capacitor insulation film is formed or when an opposite electrode is formed, the edge portion of the side wall portion 14b is broken. Thus, the yield of the final product may deteriorate. Consequently, a step for preventing the edge portion of the side wall portion 14b of the cylinder-shaped stacked type capacitor from being sharply formed should be added.

According to the related art reference, to prevent the edge portion of the side wall portion 14b form being sharply formed, after the anisotropic etching process of the polycrystal silicon film 14a is anisotropically etched out by the RIE method shown in FIG. 5, a step for wet-etching the insulation film 12 for a predetermined thickness and a step for spatter-etching the edge portion of the side wall portion 14b are required. Thus, the number of fabrication steps adversely increase.

SUMMARY OF THE INVENTION

The present invention is made from the above-described point of view. An object of the present invention is to provide a method for fabricating a semiconductor memory device that does not require many additional steps for forming the storage electrode.

A first aspect of the present invention is a method for fabricating a semiconductor memory device having a storage electrode of a DRAM having memory cells each of which is composed of one transistor and one stacked type capacitor, comprising the steps of: (a) forming an N channel type MOS transistor on the front surface of a P type silicon substrate; (b) forming a first insulation film that has an opening portion that extends to a predetermined position on the front surface of the silicon substrate; (c) forming a first conductive film that contacts the inside of the opening portion and the front surface of the first insulation film; (d) forming a second insulation film at a predetermined position of the first conductive film; (e) forming a second conductive film that covers the second insulation film; (f) anisotropically dry-etching and removing the second conductive film disposed at least on the upper front surface of the second insulation film so as to expose the upper front surface of the second insulation film; (g) isotropically dry-etching the second conductive film disposed on the side surface of the second insulation film so as to prevent the edge portion of the second conductive film from being sharply formed; and (h) etching out. the second insulation film.

A second aspect of the present invention is the method of the first aspect, wherein the step (g) is performed by using a mixture of sulfur hexafluoride ($SF_6$) gas and helium (He) gas.

According to the method for fabricating a semiconductor memory device of the present invention, at least the second conductive film disposed at the upper front surface of the second insulation film is anisotropically etched out and removed by the reactive ion etching (RIE) method. Thus, the upper front surface of the second insulation film is exposed. A second conductive film disposed on the side surface of the second insulation film is isotropically dry-etched. Thus, the edge portion of the second conductive film is prevented from being sharply formed. Consequently, unlike with the conventional method that requires a step for wet-etching an insulation film for a predetermined thickness after anisotropically etching a polycrystal silicon film, the edge portion of the side wall portion can be prevented from being sharply formed without need to use additional fabrication steps. Thus, a storage electrode of a cylinder-shaped stocked capacitor that stably operates can be fabricated.

These and other objects, features and advantages of the present invention will become more apparent in light of the following detailed description of a best mode embodiment thereof, with reference to the accompanying drawings.

BRIEF DESCRIPTION OF THE DRAWINGS

FIG. 10 is a sectional view of a work in a first step of the fabrication method of the present invention;

FIG. 11 is a sectional view of a work in a first step of the fabrication method of the present invention;

FIG. 12 is a sectional view of a work in a first step of the fabrication method of the present invention;

DESCRIPTION OF THE PREFERRED EMBODIMENT

Now, with reference to the accompanying drawings, a method of fabricating a semiconductor memory device of the present invention will be described.

Figure 9:
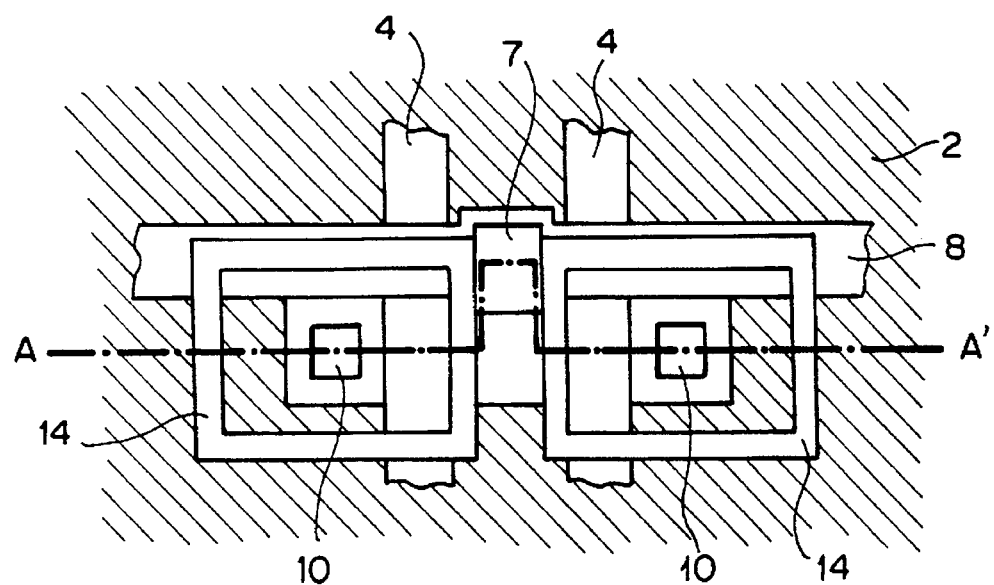
FIG. 9 is a plan view illustrating part of a semiconductor device fabricated in accordance with the method of the present invention.

FIG. 9 is a plan view of part of a semiconductor memory device fabricated in accordance with the present invention. In FIG. 9, on a silicon substrate, there are provided a device separating oxide film 2, gate electrodes 4, a first contact hole 7, a digit line 8, second contact holes 10, and side wall portion 14.

FIGS. 10 to 17 are sectional views of an intermediate work of the memory device in the sequential steps of the method of the present invention. FIGS. 10 to 17 are illustrated as sectional views taken along line A–A' in FIG. 9.

As shown in FIG. 10, a device separating oxide film 2 composed of a silicon oxide film is formed at a predetermined region on a main front surface of a P type silicon substrate 1 by the LOCOS method for a thickness of 4000 angstroms. Thereafter, a gate oxide film 3 is formed by a heat oxidizing method or the like. A gate electrode 4 composed of a polycrystal silicon of which a large amount of arsenic (As) or phosphorus (P) has been doped is selectively formed on the gate oxide film 3. Thereafter, ions of arsenic (As) are injected into the gate oxide film 3. Thus, diffusion layers 5a, 5b, and 5c are formed as a cell transistor. Next, a first inter-layer insulation film 6 is formed of a siliconoxide film ($SiO_2$) or a silicon nitride film ($Si_3N_4$).

Thereafter, as shown in FIG. 11, a first contact hole 7 that extends to the diffusion layer 5b is formed. A polycrystal silicon of which a large amount of arsenic (As) or phosphorus (P) has been doped is deposited on the entire front surface of the resultant structure and then patterned in a predetermined shape. Thus, a digit line 8 is formed. Thereafter, a second inter-layer insulation film 9 is formed of a silicon oxide film ($SiO_2$) or a silicon nitride film ($Si_3N_4$).

Next, as shown in FIG. 12, a second contact hole 10 that extends to the diffusion layers 5a and 5c is formed. A polycrystal silicon film 11a of which a large amount of arsenic (As) or phosphorus (P) has been doped is formed on the entire front surface of the resultant structure by the CVD method for a thickness of 1500 to 4000 angstroms. Thereafter, an insulation film 12 composed of a silicon oxide film is formed on the entire front surface of the resultant structure by the CVD method for a thickness of 5000 to 10000 angstroms. The height of the side surface portion of the storage electrode of the capacitor is defined by the film thickness of the insulation film 12. Thereafter, a photoresist is applied on the front surface of the insulation film 12 and then patterned in a predetermined shape by the lithography method or the like. Thus, a resist pattern 13 is formed.

Figure 13:
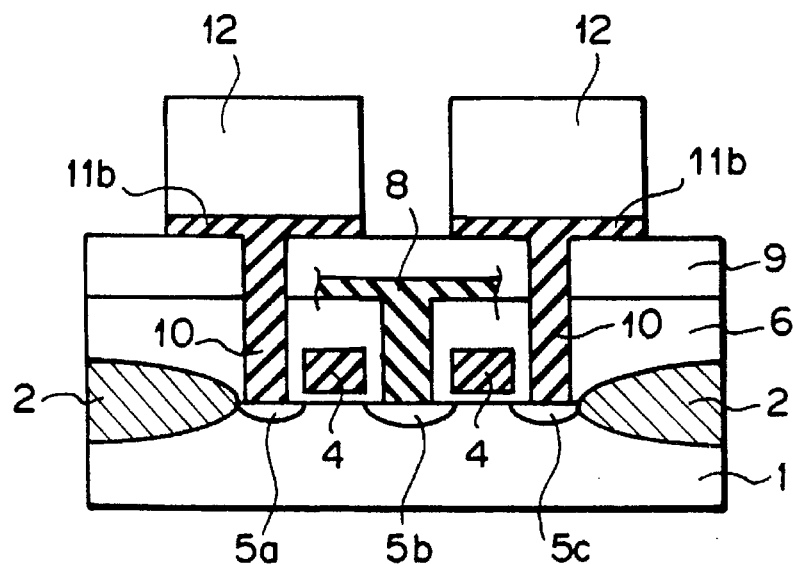
FIG. 13 is a sectional View of a work in a first step of the fabrication method of the present invention.

Thereafter, as shown in FIG. 13, with a mask of the resist patter 13, the insulation film 12 is selectively removed by an etching process for example an anisotropic etching process The resist pattern 13 is removed by an ashing method.

With a mask of the patterned insulation film 12, a base portion 11b of the cylinder-shaped stacked type capacitor storage electrode is formed by for example the anisotropic etching method. Alternatively, with the resist pattern 13, the insulation film 12 is patterned. Just after that, with a mask of the resist pattern 13, the base portion 11b may be has been doped is formed on the entire front surface of the resultant structure for a thickness of 500 to 1000 angstroms by the CVD method. The polycrystal silicon film 14a is anisotropically etched out by the RIE (reactive ion etching) method. The RIE method is performed with a parallel plate type RIE unit in the conditions that the radio frequency power is 0.3 kW/cm$^2$, the gas pressure is 150 mT, the flow rate of chlorine ($Cl_2$) gas is 50 sccm, the frequency is 13.56 MHz, and the etching time is 30 to 60 seconds.

Figure 15A:
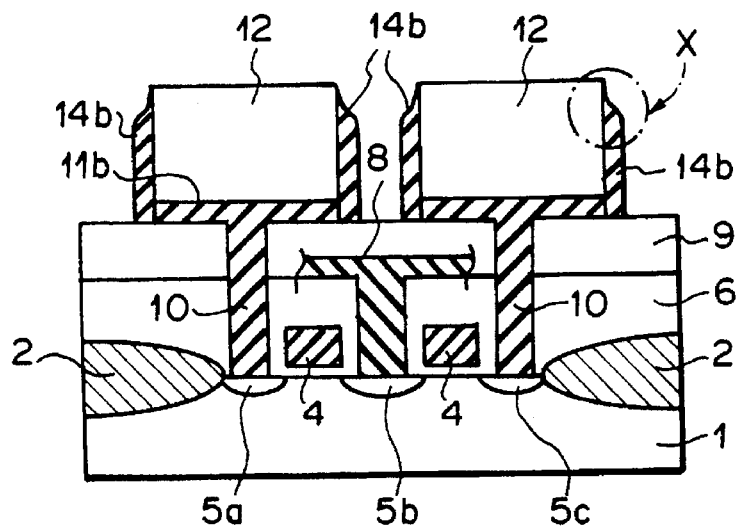
FIGS. 15A and 15B are sectional views of a work in a first step of the fabrication method of the present invention.
Figure 15B:
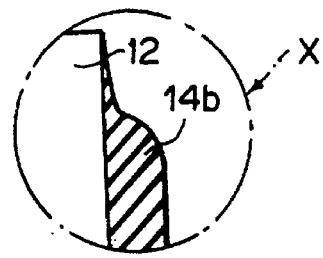
Figure 16:
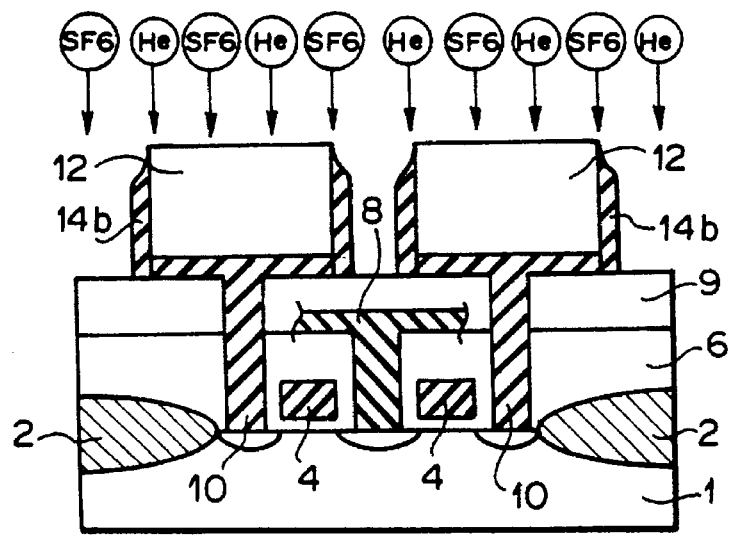
FIG. 16 is a sectional view of a work in a first step of the fabrication method of the present invention.
Figure 17A:
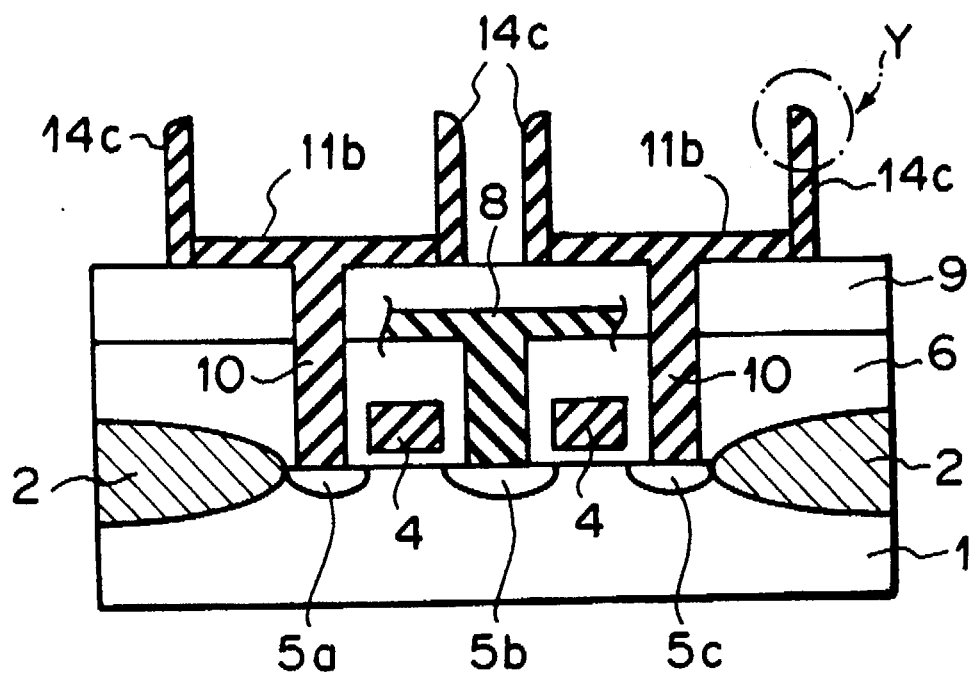
FIGS. 17A and 17B are sectional views of a work in a first step of the fabrication method of the present invention.
Figure 17B:
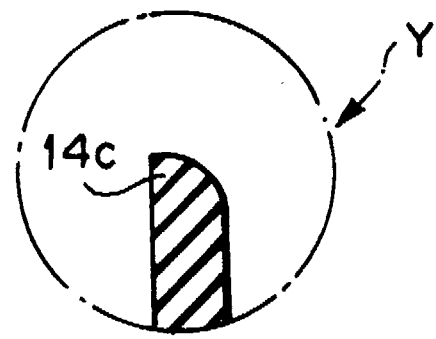

When the polycrystal silicon film 14a is anisotropically etched out by the RIE method, a side wall portion 14b as shown in FIGS. 15A and 15B are formed. FIG. 15B is an enlargement view showing a portion X of FIG. 15A.

In this state, the edge portion of the side wall portion 14b is sharply formed. When a capacitor is formed on the side wall portion 14b, an electric field concentrates at the sharp portion Thus, the service life of the capacitance insulation film decreases.

To prevent such a problem, just after the polycrystal silicon film is anisotropically etched by the RIE method, the following isotropic dry etching step is additionally performed.

Figure 1:
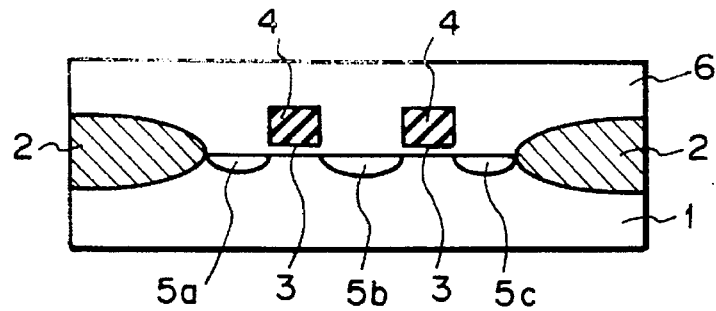
FIG. 1 is a sectional view an intermediate work of a semiconductor device in a first step of a prior art fabrication method.
Figure 2:
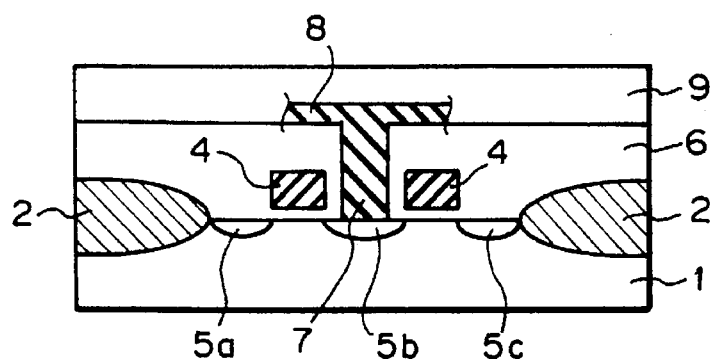
FIG. 2 is a sectional view of a work in a second step of the prior art fabrication method.
Figure 3:
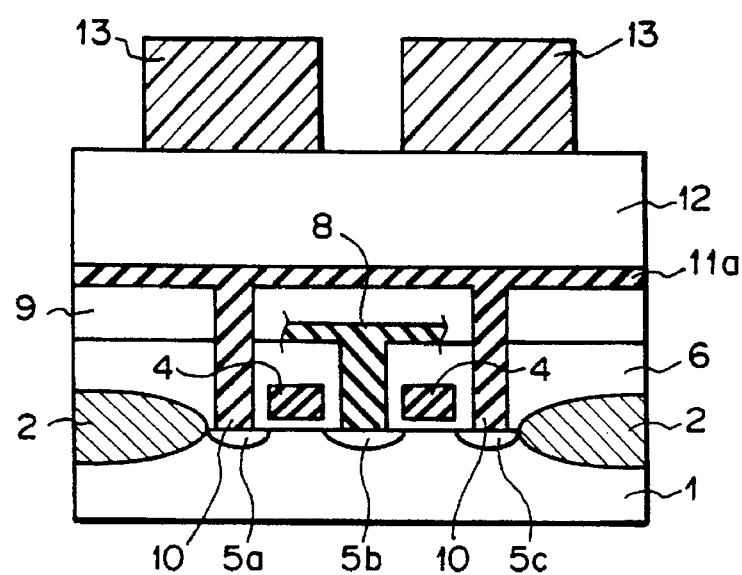
FIG. 3 is a sectional view of a work in a third step of the prior art fabrication method.
Figure 4:
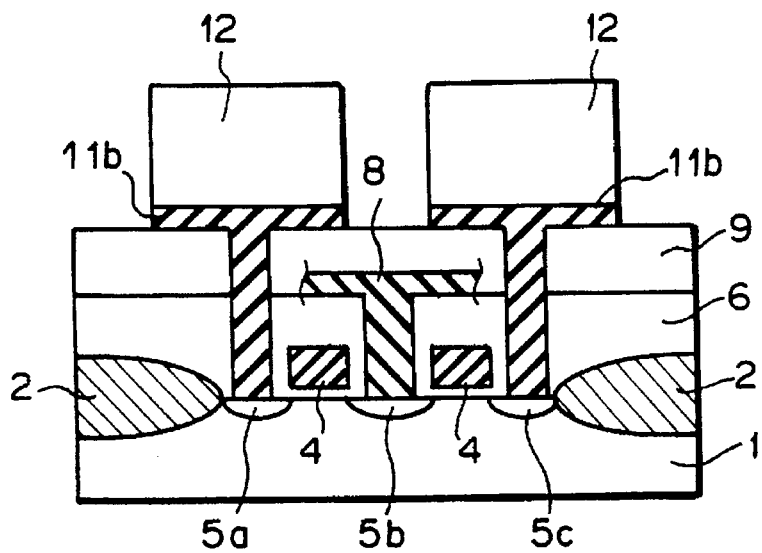
FIG. 4 is a sectional view of a work in a fourth step of the prior art fabrication method.
Figure 5:
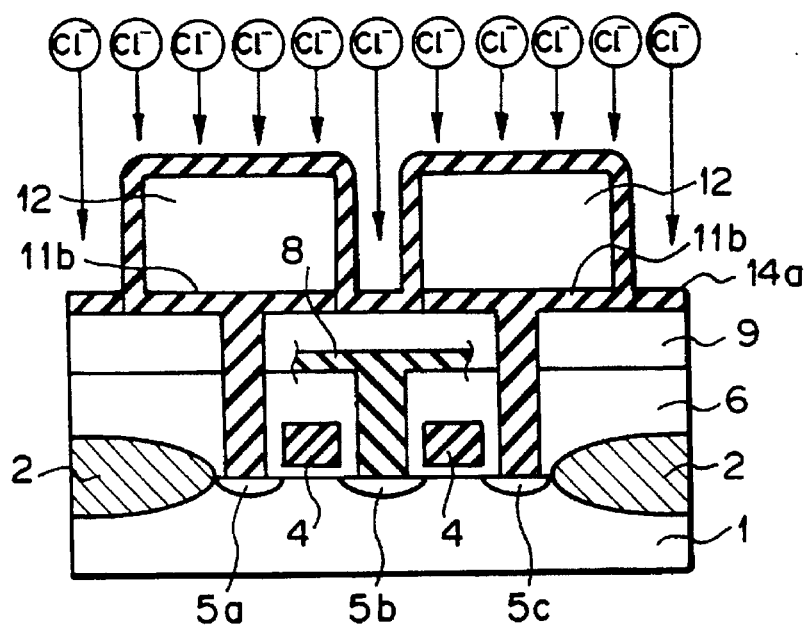
FIG. 5 is a sectional view of a work in a fifth step of the prior art fabrication method.
Figure 6A:
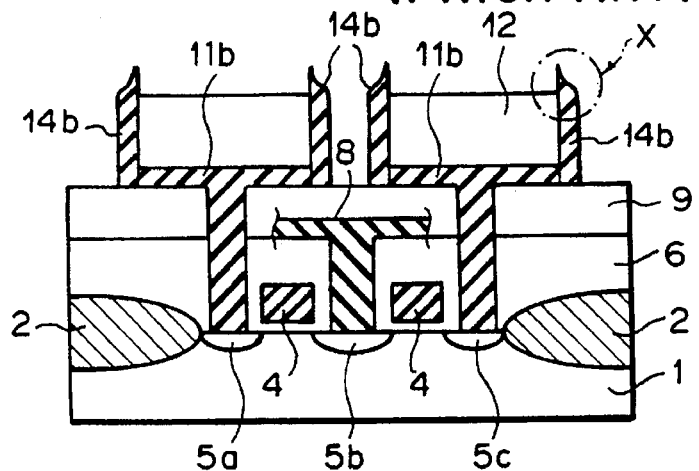
FIGS. 6A and 6B are sectional views of a work in a sixth step of the prior art fabrication method.
Figure 6B:
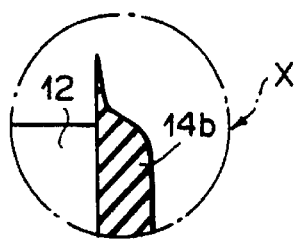
Figure 7:
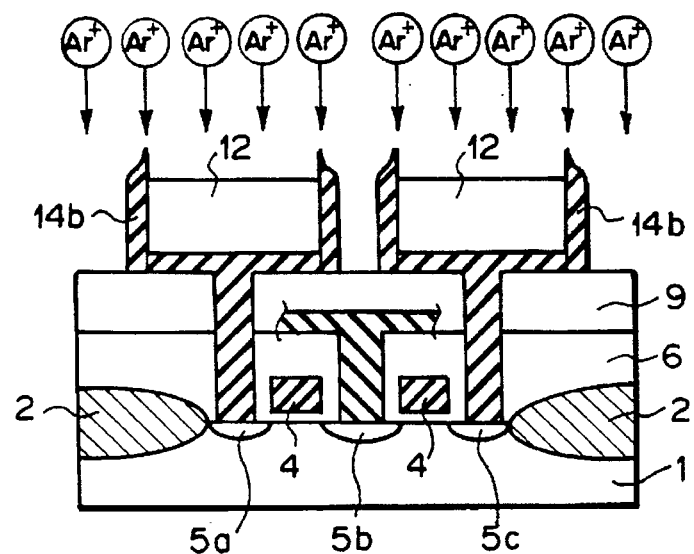
FIG. 7 is a sectional view of a work in a seventh step of the prior art fabrication method.
Figure 8A:
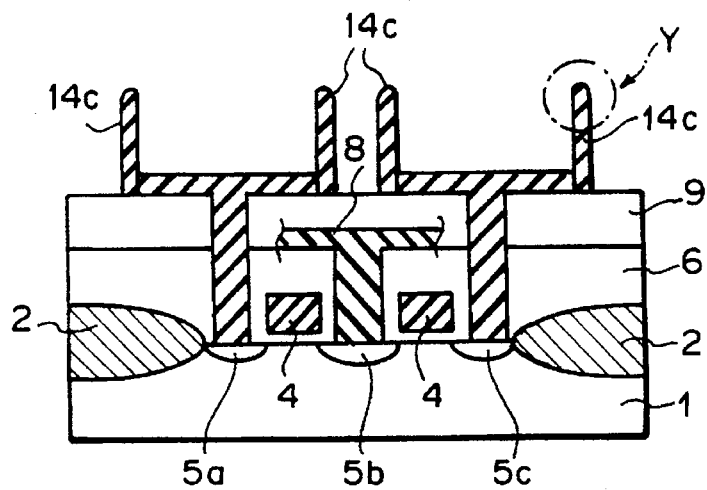
FIGS. 8A and 8B are sectional views of a work in an eighth step of the prior art fabrication method.
Figure 8B:
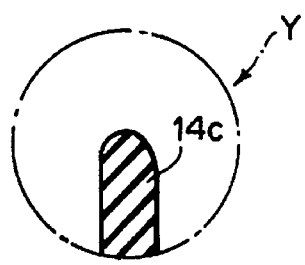

As shown in FIG. 8, with a mixture of sulfur hexafluoride ($SF_6$) gas and helium gas (He), the edge portion of the side wall portion 14b is isotropically dry-etched. The isotropic dry etching process is performed with the parallel plate type RIE unit in the conditions that the radio frequency power is 0.5 kW/cm$^2$, the gas pressure is 500 mT, the flow rate of sulphur hexafluoride ($SF_6$) gas is 100 sccm, the flow rate of helium (He) gas is 200 sccm, the frequency is 13.56 MHz, and the etching time is in the range from 30 seconds to 60 seconds. By the isotropic dry-etching process, the edge portion of the side wall portion shown in FIG. 15 is removed.

In the state shown in FIG. 15, the edge portion of the side wall portion 14b is removed by the isotropic dry-etching method. After the etching process, the insulation film 12 is completely removed by the wet-etching method using hydrogen fluoride. The side wall portion 14c that does not have a sharp portion shown in FIGS. 17A and 17B can be obtained. FIG. 9B is an enlargement view showing a portion Y of FIG. 9A.

Thus, the storage electrode of the cylinder-shaped stacked type capacitor that does not have a sharp portion of the side wall portion 14c can be obtained.

Figure 14:
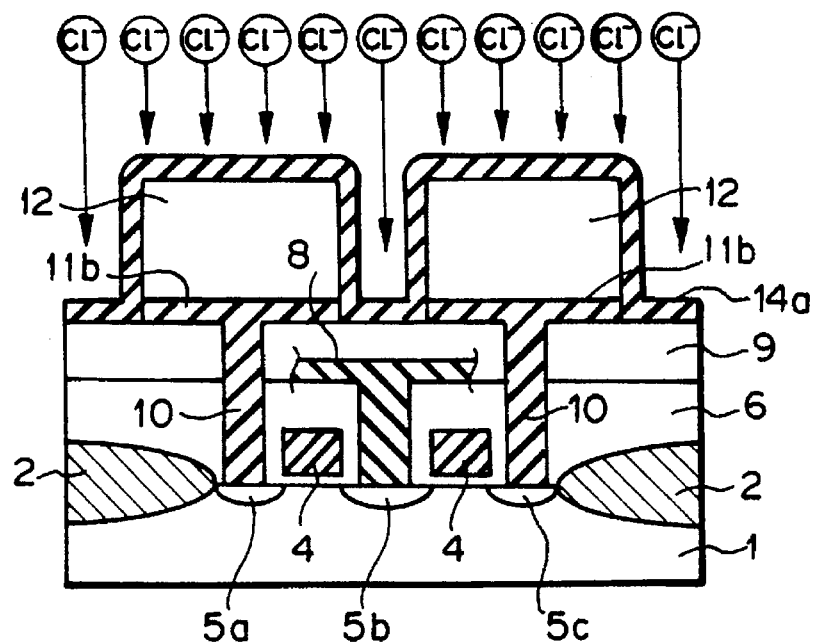
FIG. 14 is a sectional view of a work in a first step of the fabrication method of the present invention.

As described above, the method for fabricating a semiconductor memory device according to the present invention is a method for fabricating a storage electrode of a DRAM having memory cells each of which is composed of one transistor and one stacked type capacitor. In this method, a polycrystal silicon film 14a shown in FIG. 14 is anisotropically etched out by the RIE method. Thereafter, the resultant silicon substrate is isotropically etched out and the sharp portion of the edge portion of the side wall portion is removed in the same etching unit, not unloaded therefrom. Thus, the number of fabrication steps is smaller than that of the conventional method. Consequently, the fabrication cost can be reduced.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A method for fabricating a semiconductor memory device having a storage electrode of a DRAM having memory cells each of which is composed of one transistor and one stacked capacitor, comprising the steps of:

(a) forming an N channel MOS transistor on the front surface of a P type silicon substrate;

(b) forming a first insulation film that has an opening portion that extends to a position on the front surface of the silicon substrate;

(c) forming a first conductive film that contacts the inside of the opening portion and the front surface of the first insulation film;

(d) forming a second insulation film at a position of the first conductive film;

(e) forming a second conductive film that covers the second insulation film;

(f) anisotropically dry-etching and removing the second conductive film disposed at least on the upper front surface of the second insulation film so as to expose the upper front surface of the second insulation film;

(g) isotropically dry-etching the second conductive film disposed on the side surface of the second insulation film so as to prevent the edge portion of the second conductive film from being sharply formed; and (h) etching out the second insulation film.

2. The method as set forth in claim 1, wherein said step (g) is performed by using a mixture of sulfur hexafluoride ($SF_6$) gas and helium (He) gas.

* * * * *

UNITED STATES PATENT AND TRADEMARK OFFICE
CERTIFICATE OF CORRECTION

PATENT NO.    : 5,661,065
DATED         : August 26, 1997
INVENTOR(S)   : Hiroki KOGA It is certified that error(s) appears in the above-identified patent and that said Letters Patent is hereby corrected as shown below:

Column 3, line 4, change "1.9" to --1.0--.

Signed and Sealed this

Sixteenth Day of December, 1997

Attest:

BRUCE LEHMAN

Attesting Officer

Commissioner of Patents and Trademarks